(12) United States Patent
Wei et al.

(10) Patent No.: US 8,029,875 B2
(45) Date of Patent: Oct. 4, 2011

(54) PLASMA IMMERSION ION PROCESSING FOR COATING OF HOLLOW SUBSTRATES

(75) Inventors: Ronghua Wei, San Antonio, TX (US); Christopher Rincon, San Antonio, TX (US); James H. Arps, Chanhassen, MN (US)

(73) Assignee: Southwest Research Institute, San Antonio, TX (US)

( * ) Notice: Subject to any disclaimer, the term of this patent is extended or adjusted under 35 U.S.C. 154(b) by 451 days.

(21) Appl. No.: 11/752,787

(22) Filed: May 23, 2007

(65) Prior Publication Data
US 2008/0292806 A1 Nov. 27, 2008

(51) Int. Cl.
*H05H 1/24* (2006.01)

(52) U.S. Cl. ........ 427/570; 427/574; 427/577; 427/578; 427/523

(58) Field of Classification Search .................. 427/452, 427/523, 577, 249.7, 294, 230, 236, 237, 427/238, 570, 574, 578
See application file for complete search history.

(56) References Cited

U.S. PATENT DOCUMENTS

| | | |
|---|---|---|
| 4,374,722 A | 2/1983 | Zega |
| 4,377,773 A | 3/1983 | Hershcovitch et al. |
| 4,407,712 A | 10/1983 | Henshaw et al. |
| 4,520,268 A | 5/1985 | Xu |
| 4,680,197 A | 7/1987 | Sagoi et al. |
| 4,731,539 A | 3/1988 | Xu |
| 4,764,394 A | 8/1988 | Conrad |
| 4,795,942 A | 1/1989 | Yamasaki |
| 5,458,927 A | 10/1995 | Malaczynski et al. |
| 5,483,121 A | 1/1996 | Okagaki et al. |
| 5,593,798 A | 1/1997 | Muller et al. |
| 5,605,714 A | 2/1997 | Dearnaley et al. |
| 5,725,573 A | 3/1998 | Dearnaley et al. |
| 6,055,928 A * | 5/2000 | Murzin et al. ............ 118/723 E |
| 6,087,025 A | 7/2000 | Dearnaley et al. |
| 6,120,660 A | 9/2000 | Chu et al. |
| 6,410,144 B2 | 6/2002 | Dearnaley et al. |
| 6,497,803 B2 | 12/2002 | Glocker et al. |
| 6,514,565 B2 | 2/2003 | Dearnaley et al. |
| 6,524,538 B2 | 2/2003 | Barankova et al. |
| 6,572,933 B1 * | 6/2003 | Nastasi et al. ................. 427/523 |

(Continued)

FOREIGN PATENT DOCUMENTS

JP 02205666 A 8/1990

(Continued)

OTHER PUBLICATIONS

Wei, Ronghua, et al., "Magnetic field enhanced plasma (MFEP) deposition of inner surfaces of tubes". Surface and Coatings Technololgy 188-189 (2004) pp. 691-696.*

(Continued)

*Primary Examiner* — Bret Chen
(74) *Attorney, Agent, or Firm* — Grossman, Tucker et al.

(57) ABSTRACT

The present disclosure relates to a method for plasma ion deposition and coating formation. A vacuum chamber may be supplied, wherein the vacuum chamber is formed by a hollow substrate having a length, diameter and interior surface. A plasma may be formed within the chamber while applying a negative bias to the hollow substrate to draw ions from the plasma to the interior surface of the hollow substrate to deposit ions onto the interior surface and forming a coating. The coating may have a Vickers Hardness Number (Hv) of at least 500.

14 Claims, 4 Drawing Sheets

U.S. PATENT DOCUMENTS

| | | | |
|---|---|---|---|
| 6,632,482 B1 | 10/2003 | Sheng | |
| 6,767,436 B2 | 7/2004 | Wei et al. | |
| 6,878,404 B2 | 4/2005 | Verrasamy et al. | |
| 6,893,907 B2* | 5/2005 | Maydan et al. | 438/149 |
| 7,052,736 B2 | 5/2006 | Wei et al. | |
| 7,094,670 B2 | 8/2006 | Collins et al. | |
| 7,300,684 B2 | 11/2007 | Boardman et al. | |
| 2004/0025454 A1* | 2/2004 | Burgess | 52/204.1 |
| 2004/0055870 A1 | 3/2004 | Wei | |
| 2004/0084152 A1 | 5/2004 | Gregoire et al. | |
| 2005/0061251 A1* | 3/2005 | Wei et al. | 118/726 |
| 2005/0287307 A1* | 12/2005 | Singh et al. | 427/523 |
| 2006/0011468 A1* | 1/2006 | Boardman et al. | 204/192.12 |
| 2006/0076231 A1 | 4/2006 | Wei | |
| 2006/0076235 A1 | 4/2006 | Wei | |
| 2006/0121704 A1* | 6/2006 | Walther et al. | 438/510 |
| 2006/0196419 A1 | 9/2006 | Tudhope et al. | |
| 2006/0251917 A1 | 11/2006 | Chiang et al. | |
| 2008/0292806 A1 | 11/2008 | Wei et al. | |
| 2009/0280276 A1* | 11/2009 | Noll | 428/34.1 |
| 2010/0006421 A1 | 1/2010 | Wei | |
| 2010/0154197 A1* | 6/2010 | Palmaz et al. | 29/557 |

FOREIGN PATENT DOCUMENTS

JP 02243766 9/1990

OTHER PUBLICATIONS

Tian, Xiubo, et al., "Theoretical investigation of plasma immersion ion implantation of cylindrical bore using hollow cathode plasma discharge". Surface and Coatings Technololgy 203 (2009) pp. 2727-2730.*

Zizka, E., "Plasma deposition of thin metal layers in the discharge with a hollow target". Czech. J. Phys. B 33 (1983), pp. 14-24.*

Tabuchi, Toshihiro, et al., "Hollow electrode enhanced radio frequency glow plasma and its application to the chemical vapor deposition of microcrystalline silicon". J. Vac. Sci. Technol. A 22(5), Sep./Oct. 2004 pp. 2139-2144.*

Liang, Gou-Tsau, et al., "Diamond growth by hollow cathode arc plasma chemical vapor deposition." Journal of Materials Research, vol. 13, No. 11, Nov. 1998, pp. 3114-3121.*

Chen, et al., "Development and Characterization of Micromachined Hollow Cathode Plasma Display Devices," Journal of Microelectromechanical Systems, vol. 11, No. 5, Oct. 2002. pp. 536-543.

Anders, "From Plasma Immersion Ion Implantation to Deposition: A Historical Perspective on Principles and Trends," Surface and Coatings Technology, vol. 156, Issues 1-3, Jul. 1, 2002, pp. 3-12.

Kostov, et al., "Two Dimensional Computer Simulation of Plasma Immersion Ion Implantation," Brazilian Journal of Physics, vol. 34, No. 4B, Dec. 2004, pp. 1689-1695.

"Plasma-enhanced Chemical Vapor Deposition," available at http://en.wikipedia.org/wiki/Plasma-enhanced_chemical_vapor_deposition, retrieved on May 18, 2007, 3 pages.

"Diamond-like Carbon," available at http://en.wikipedia.org/wiki/Diamond-like_carbon, retrieved on May 16, 2007, 6 pages.

Apetrei, et al., "Characterization of a Modified Hollow-cathode Discharge Plasma by Optical Means," 32nd EPS Conference of Plasma Phys. Tarragona, Jun. 27-Jul. 1, 2005 ECA vol. 29C, P-4.139 (2205), 4 pages.

Shader, et al., "Hollow Cathode Lamps—Yesterday, Today and Tomorrow," Mar. 1999, available at https://www.varianinc.com/media/sci/apps/a-aa14.pdf, retrieved on May 15, 2008, 7 pages.

"Plasma Immersion Ion Implantation (PI3)—The Technology, Applications and Success to Date," Materials Australia, vol. 34, No. 1, p. 9, Jan./Feb. 2002, available at http://www.azom.com/details.asp?ArticleID=2090, retrieved on May 16, 2007, 3 pages.

"Plasma Immersion Ion Processing," 18-Steam Turbine Technology Brochure, available at http://www.swri.org/3pubs/brochure/d18/plasma/plasma.htm, retrieved on May 16, 2007, 2 pages.

"Hollow Cathodes," available at http://www.engr.colostate.edu/ionstand/research_hollowcathods.html, retrieved on May 17, 2007, 3 pages.

"Hollow Cathode Plasma Source," available at http://www.vtd.de/en/produkte/komponenten/ko_ref2.php, retrieved on May 17, 2007, 1 page.

"Cold War Against Hydrates," available at http://www.ntnu.no/gemini/2003-06e/28-31.htm. retrieved on May 16, 2007, 5 pages.

Wei, "A novel High-Intensity Metal Ion Source for Plasma Immersion Implantation and Deposition (MPIII&D) 18-9292," available at http://www.swri.org/3pubs/IRD2003/Synopses/189292.htm, retrieved on May 16, 2007, 2 pages.

"SwRI Surface Modification Facility Offers Two New Capabilities," available at http://www.swri.org/9what/releases/2000/PIIP.htm, retrieved on May 16, 2007, 2 pages.

Monaghan, et al. "Diamond-Like Carbon Coatings," Materials World, vol. 1 No. 6 pp. 347-349, Jun. 1993, available at http://www.azom.com/details.asp?ArticleID=623, retrieved on May 16, 2007.

International Search Report and Written Opinion dated Aug. 26, 2008 issued in related International Patent Application No. PCT/US08/64344.

Xu, et al. "Double glow plasma surface alloying and plasma nitride," Surface and Coating Technology vol. 201, Issue 9-11, Feb. 2007, pp. 4822-4825 (abstract enclosed).

Hosokawa, et al., "Self-sputtering phenomena in high-rate coaxial cylindrical magnetron sputtering," J. Vac. Sci. Technol., vol. 14, No. 1, Jan./Feb. 1997. pp. 143-146.

\* cited by examiner

PLASMA IMMERSION ION PROCESSING FOR COATING OF HOLLOW SUBSTRATES

FIELD

This disclosure relates to an apparatus and methods for coating interior surfaces of hollow substrates which may have relatively high aspect ratios (L/D) via plasma ion processing which may then provide a relatively high hardness wear-resistant coating.

BACKGROUND

Crude oil is a naturally occurring substance including a complex mixture of hydrocarbons of various lengths. Crude oil may be found in porous rock formations or mixed in sand in the upper strata of the earth's crust. The crude oil may pool into reservoirs into which from which the oil may be extracted. Once extracted, the crude oil may be transported to various destinations by pipelines. The pipelines, however, may be subject to material build-up and wear. For example, waxes contained in the crude oil and hydrates formed at a water/oil interface may build-up in the pipelines resulting in occlusions which may necessitate cleaning and may possibly even halt production. In addition, wear may occur due to, for example, friction generated by the flow of the crude oil in the pipeline or particulate matter that may be present in the crude oil.

The same may be true for other transportation pipelines as well. For example, relatively large scale pipelines may carry water, brine or sewage over relatively long distances. Smaller scale pipelines may carry materials throughout a plant, such as polymer pellets, grains or chemical compounds, etc. Depending on the materials carried, many of these pipelines may experience similar problems with respect to wear and material build-up.

SUMMARY

In a first exemplary embodiment, the present disclosure relates to a method for plasma ion deposition and coating formation. The method includes providing a vacuum chamber from a hollow substrate having a length, diameter and interior surface and reducing the pressure in the chamber and introducing a precursor gas. This may then be followed by generating a plasma within the chamber and applying a negative bias to the hollow substrate to draw ions from the plasma to the interior surface of the hollow substrate to form a coating. The coating may have a Vickers Hardness Number (Hv) of at least 500.

In another exemplary embodiment, the present disclosure may again amount to a method for plasma ion deposition and coating formation by initially providing a vacuum chamber from a hollow substrate having a length, diameter and interior surface including an electrode extending along all or a portion of the hollow substrate length. This may then be followed by reducing the pressure in the chamber and introducing a precursor gas and generating a plasma within the chamber. One may then again apply a negative bias to the hollow substrate to draw ions from the plasma to the interior surface of the hollow substrate to form a coating.

In an exemplary apparatus form, the present disclosure relates to an apparatus for plasma ion coating including an electrically conductive hollow substrate having a length, diameter and interior surface capable of enclosing volume. A gas inlet may then be provided which is capable of supplying one or more precursor gases to the enclosed volume wherein the one or more precursor gases is capable of forming a plasma. The apparatus may also include a device for evacuating the volume to a selected pressure level along with a power supply device capable of providing a pulsed voltage to negatively bias the hollow substrate to form plasma ions and to draw the ions to the interior surface of the hollow substrate.

BRIEF DESCRIPTION OF THE DRAWINGS

The detailed description below may be better understood with reference to the accompanying figures which are provided for illustrative purposes and are not to be considered as limiting any aspect of the invention.

DETAILED DESCRIPTION

The present disclosure relates to a coating and the application thereof, wherein the coating may be resistant to material build-up and wear. The coatings may amount to what may be termed a diamond like carbon (DLC) coating (i.e. a coating formed from amorphous carbon) which may be applied by a plasma coating process onto the surfaces of hollow substrates, and in particular, an interior surface. Such coatings may be utilized in pipelines and other applications which may then prevent or reduce material build-up or wear.

A hollow substrate may be understood herein as a substrate initially having exposed exterior and interior surfaces which may define some amount of interior volume and which may also have a relatively high aspect ratio (AR). The aspect ratio may be understood as the ratio of length (L) to the diameter (D) of the substrate, or L/D. Objects having a relatively high aspect ratio herein may have a length to cross-sectional area ratio of two or more, including all values and increments in the range of about 2 to about 3,000. For example, objects herein may have an aspect ratio of greater than or equal to 10. As may therefore be appreciated, such aspect ratios may define a structure such as a section of pipe which may have, e.g., lengths up to 25 feet (7.62 meters) including all values and increments therein, at diameters of about 3-10 inches (7.6 cm to 25.4 cm). It may therefore be appreciated that one may conveniently utilize a pipe having a length of about 20 feet (6.10 meters) at about a 4 inch diameter (10.2 cm) which therefore defines an exemplary aspect ratio of at least 60 or higher.

The hollow substrates herein, as explained more fully below, may also be those which may define all or a portion of a vacuum chamber, which vacuum chamber may then contain the formed plasma (ionized gas) for coating purposes. The hollow substrate defining the vacuum chamber may then itself become electrically biased in an amount suitable to attract plasma ions (e.g. positive ions or $I^+$) for a coating formation.

Figure 1A:
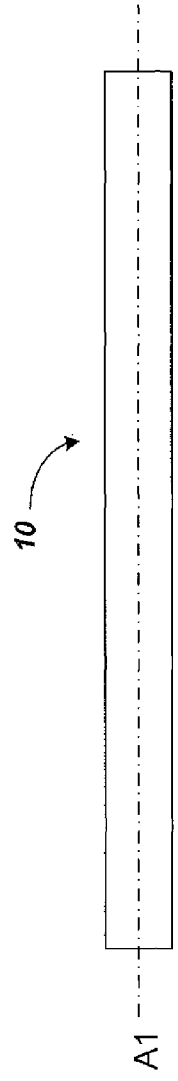
FIGS. 1a-d illustrates exemplary hollow substrates.
Figure 1B:
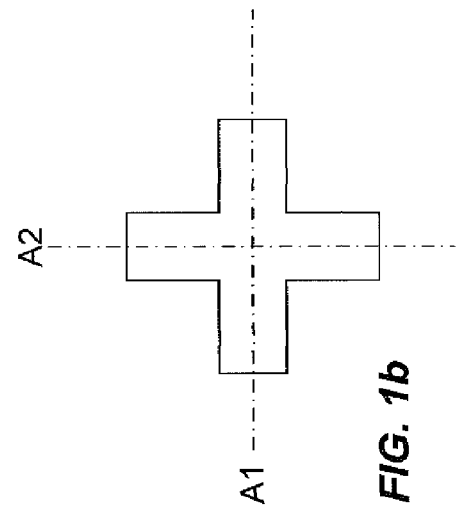
Figure 1D:
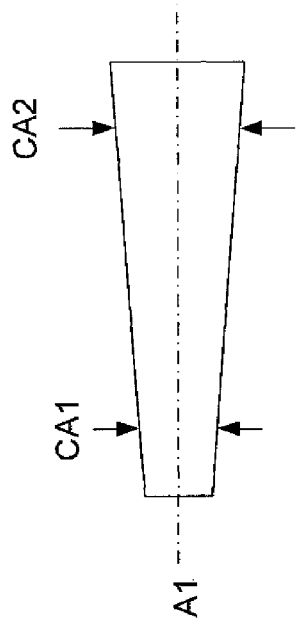
Figure 1C:
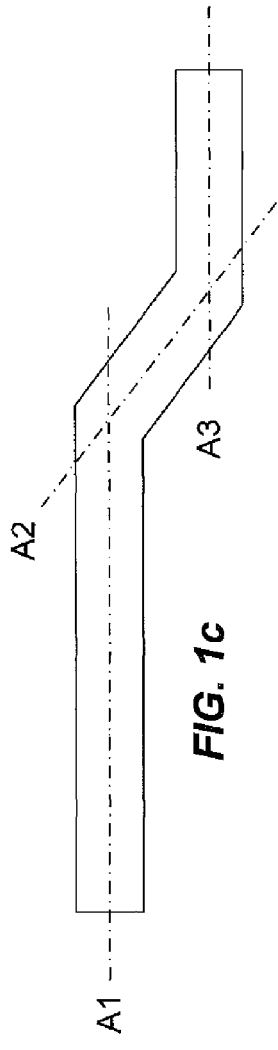

Exemplary views of hollow substrates suitable for plasma coating herein are illustrated in FIGS. 1a-1c. It should be appreciated that while the hollow generally tubular substrate 10 may be formed around a single axis A as illustrated in FIG. 1a, the tubular substrate may be formed around multiple axis A1, A2, A3 as well as those illustrated in FIGS. 1b and 1c. In addition, the hollow substrates may have a single cross-sectional area, as illustrated in FIGS. 1a-1c, as well as different cross-sectional areas, CA1, CA2, along a length or portions of the hollow substrate, as illustrated in FIG. 1d. The tubular substrates may include metals and metal alloys, such as iron based metals including steel, stainless steel or carbon steel, aluminum, aluminum alloys, etc. In addition, metalloids or ceramics may be utilized as well such as silicon. Some polymer materials may also be utilized, however, material selection may be sensitive to the coating process parameters noted herein.

Figure 2:
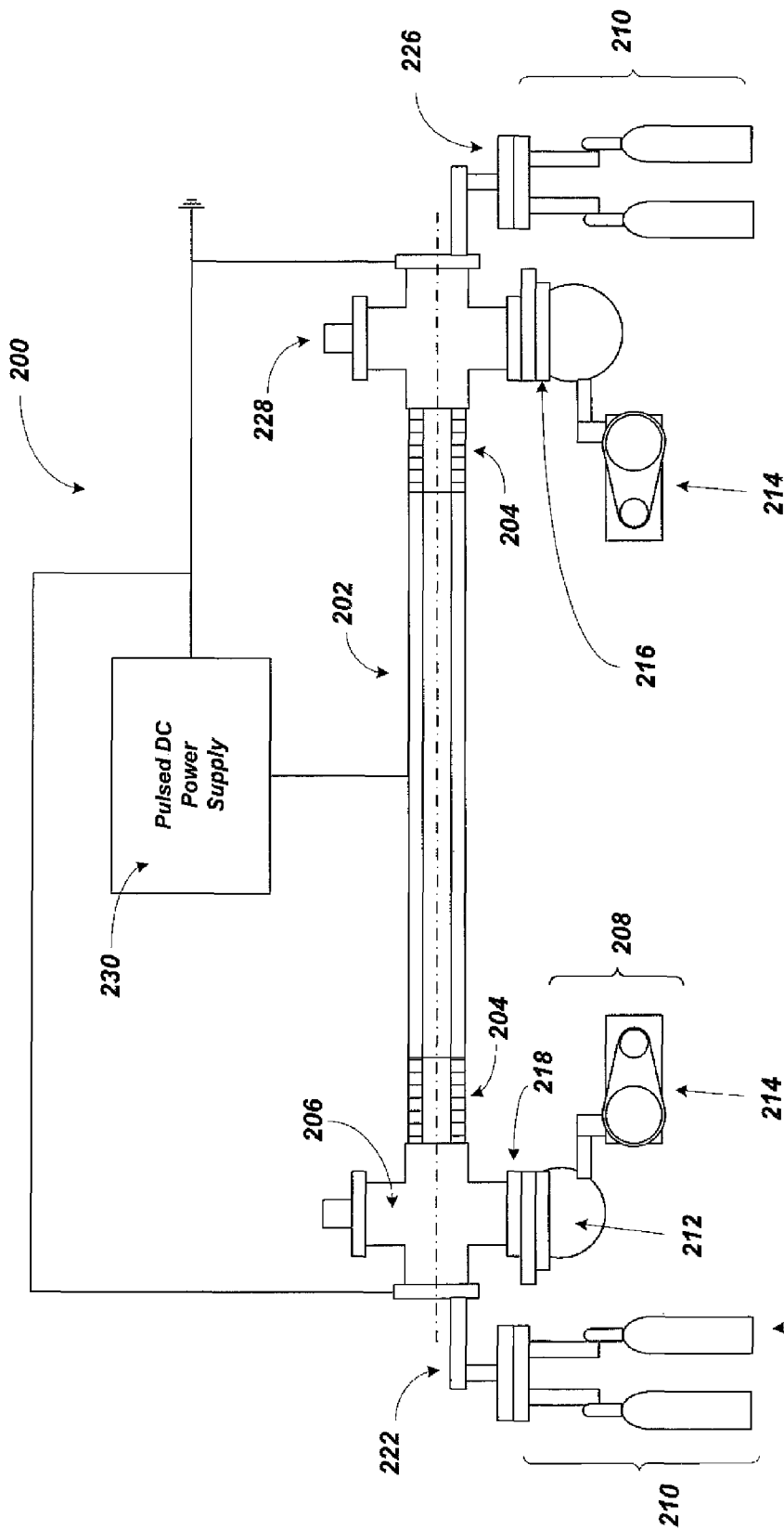
FIG. 2 illustrates an exemplary plasma immersion ion processing device.

FIG. 2 illustrates an exemplary apparatus or system 200 for applying coatings on an interior portion of a relatively high aspect ratio hollow substrate. Specifically, a tubular substrate 202 may be mounted in between two insulators 204. The insulators 204 may be affixed to a multi-port fitting/coupling 206 formed of metal material which may provide fluid communication between the interior portion of the tubular object and a vacuum system 208 and a gas supply system 210. It should be appreciated that the vacuum system 208 and gas supply system 210 may be provided at one or both ends of the tubular substrate (as illustrated). In addition, although shown in generally horizontal configuration, it is contemplated herein that the hollow substrate 202 may be positioned vertically (i.e. at an angle of between about 45-90 degrees with respect to a horizontal plane). In such configuration, it may be appreciated that the vertical configuration may provide that carbon soot or other types of by-products, developed during the plasma formation, can fall more freely to the bottom of the hollow substrate and be more readily removed from the system.

To evacuate the tubular substrate 202 the vacuum system 208 may be provided in fluid communication with the interior portion of the tubular object 202. The vacuum system 208 may include, for example a momentum transfer pump 212 and a positive displacement, i.e., mechanical pump 214. Exemplary momentum transfer pumps may include diffusion pumps or turbomolecular pumps. One or more valves may be positioned between the vacuum system 208 and the tubular object. As presently illustrated the valves may include a throttle valve 216 and a gate valve 218. It should be appreciated that a number of other valves may be utilized as may be necessary by system requirements.

As noted above, gasses may be supplied to the tubular object 202 via a gas supply system 210, which may also be present at both ends of the hollow substrate, or at one end thereof, and which may include a gas inlet port 222. Gasses may therefore be fed from one or more storage devices 224 to the gas inlet port 222. One or more valves and/or regulators 226 may be supplied between the storage device 224 and the gas inlet port 222 aiding in the control of gas flow and pressure in the system 200. Furthermore, a pressure gauge 228 may be positioned on the multiport fitting/couplings 206 at one or both ends of the tubular substrate. The pressure gauge 228 may allow for the measurement of system pressure, which measurements may then be used to adjust or maintain the system pressure in a desired range or at a desired value. Accordingly, the control of pressure and/or gas flow may be provided manually or by an automated feed back system.

A relatively high voltage pulsating DC power supply 230 may be connected to the hollow substrate 202 as illustrated which may then provide that the hollow substrate becomes biased with a negative voltage so that it may draw ions from the plasma to the substrate inner surface, wherein the ions may then simultaneously impinge on the inner surface to form a coating as explained more fully below. The voltage pulses may be less than or equal to about 10 kV. The pulse frequency may be about 100 Hz to about 20 kHz, including all values and increments therein, at a pulse width from about 5 microseconds to about 40 microseconds, including all values and increments therein.

Figure 3:
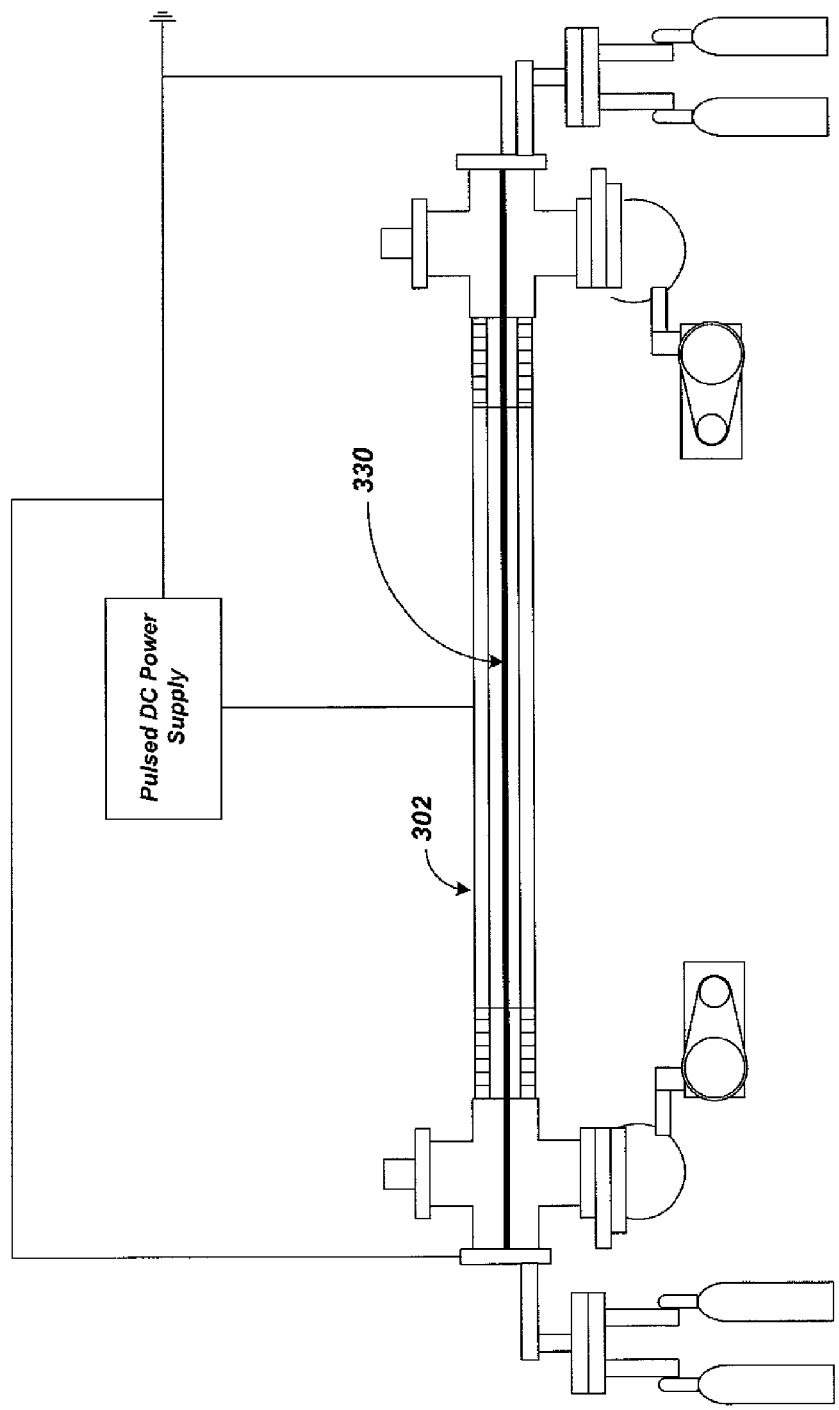
FIG. 3 illustrates another exemplary plasma immersion ion processing device illustrating the placement of an electrode within the hollow substrate.

Furthermore, with attention to FIG. 3, the electrode 330 may be configured such that it may be connected to ground or be positively biased and configured to oppose the inner surface of the tubular substrate 302. This may then provide for relatively more uniform plasma formation within the hollow substrate as well as relatively more uniform ion coating of the hollow substrate inner surface. It may therefore be appreciated that FIG. 3 may include all of the illustrated features of FIG. 2 to regulate plasma formation wherein the electrode 330 may be specifically placed at about the center of the hollow substrate which may therefore be described as a center type electrode. In addition, it is contemplated herein that the electrode 330 may itself be hollow with one or a plurality of spaced openings so that it may provide a pathway for the plasma precursor gases to travel down the length of such hollow electrode and be more uniformly distributed within a given hollow substrate. Such hollow electrode may itself have a diameter of up to about 0.50" (1.27 cm), including all values and ranges therein. For example, the hollow electrode may have a diameter of about 0.25" (0.63 cm) to about 0.50" (1.27 cm). In addition, as noted above, in the event that the hollow substrate is positioned vertically, it may provide a more convenient configuration to ensure that the hollow electrode may span along the entire length of the substrate without contacts the inner surface and without the need for interim support.

Figure 4:
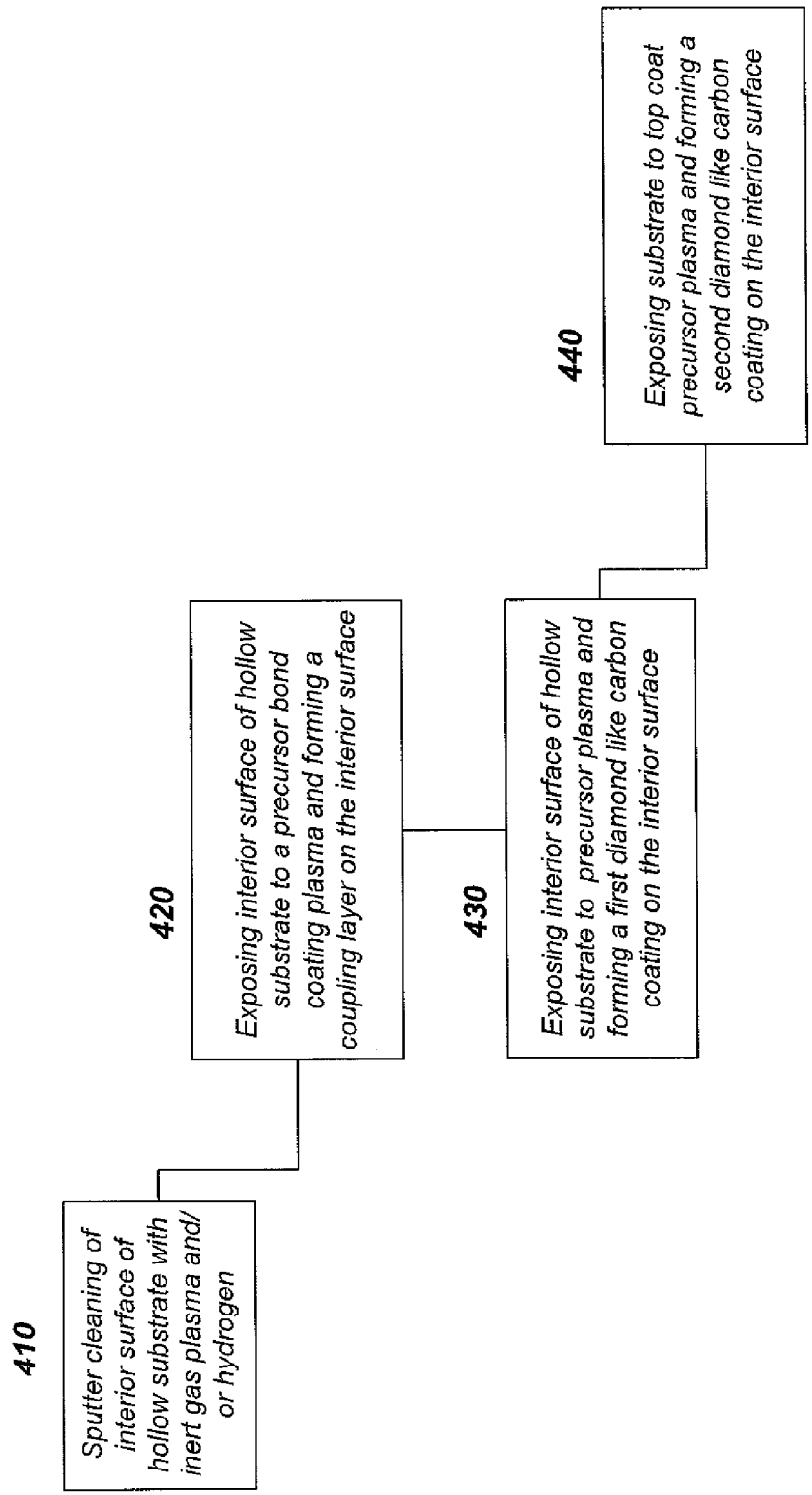
FIG. 4 is an exemplary flow chart identifying the method of forming a coating on a tubular substrate.

An exemplary method of forming a wear and resistant coating on a hollow substrate is next illustrated in FIG. 4. As an initial and optional step 410, the interior surface of the hollow substrate may undergo sputter cleaning in the presence of an inert gas plasma or hydrogen. This may then substantially remove those contaminants (e.g. surface oxides and organic contaminants) from the inner surface which may then provide an improved ability to undergo ion coating. Reference to surface oxides may be understood herein as compounds containing oxygen, such as a metal oxide (e.g. aluminum oxide). It may therefore be appreciated that the cleaning step may involve the introduction of an inert gas, such as argon, or a combination of argon (Ar) and a reactive gas such as hydrogen, to a pressure of about 0.5 to about 100 millitorr (mTorr) including all values and increments therein. As alluded to above, a pulse frequency of from about 100 Hz to about 20 kHz may be applied, at a pulse width of about 5 microseconds to about 40 microseconds, to negatively bias the tube up to about 10 kV with respect to ground, for a period of up to about 60 minutes, including all values and increments therein. For example, it has been found useful to negative bias the tube at about 4 kV for a period of about 30 minutes. The argon ions may then be drawn to the inner surface to thereby provide sputter cleaning, wherein, e.g. about 75-100% of the surface oxides may be removed.

The interior surface of the hollow substrate may also be optionally provided with a precursor bond coat which may be applied as an amorphous (non-crystalline) coupling layer as between the metallic surface and outer coating layers. Reference to coupling layer is reference to the feature that the precursor bond coat may improve the bonding strength as between the coating layer and the substrate surface. Suitable silicon containing precursors include, e.g. silane compounds, which may be understood as the silicon analogue of an alkane hydrocarbon, of the formula $Si_nH_{2n+2}$ wherein n is an integer and may have a value of 1-10. For example, a suitable silane compound may therefore include silicon tetrahydride ($SiH_4$). The silane compound may also include substituted aliphatic and/or aromatic functionality, e.g. trimethylsilane [$SiH(CH_3)$ ₃]. Similar to the above, the bond layer may be applied at pulse frequency of from about 100 Hz to about 20 kHz may be applied, at a pulse width of about 5 microseconds to about 40 microseconds, to negatively bias the tube up to about 10 kV with respect to ground, for a period of up to about 60 minutes, including all values and increments therein. For example, it has been found useful to negatively bias the tube at about 4 kV for a period of about 15 minutes Whether or not the above two steps are applied, the inner surface of the hollow substrate, i.e. an inner surface without sputter cleaning and/or a precursor bond coating, may then be exposed to a plasma containing one or more inorganic or organic gaseous precursors, which may be understood as any gas capable of forming an ion plasma, and which may then provide an inner surface wear-resistant coating of a desired thickness and hardness. The coatings may be applied on all or a portion of the inner surface of the hollow substrate, and may be relatively uniform in thickness, i.e. where such coating does not vary in thickness by more than about +/−20% along the length of a given hollow substrate.

The coatings may also exhibit a Vickers Hardness Number (Hv) of 500 or greater, including all values and increments in the range of 500 to 3000 (Hv). As alluded to above, the coatings herein may therefore be understood to include, but not be limited to, those coatings which are termed diamond like carbon (DLC) coatings which may be understood herein as coating that contain some amount of amorphous carbon. In addition, such coatings may include those which may exhibit a dry sliding (kinetic) coefficient of friction ($\mu_k$) in the range of 0.01 to 0.2, including all values and increments therein. Furthermore, the coatings may exhibit an electrical resistivity in the range of about $10 \times 10^6$ to $10 \times 10^{14}$ ohm/cm, including all values and increments therein. The coatings may be applied at thicknesses in the range of about 0.1 to 15 microns, including all values and increments therein. The coatings also may exhibit a water contact angle (CA) in the range of 60° to 110°, including all values and increments therein. The contact angle may be understood as the shape of a liquid water droplet as it rests on a solid surface. The contact angle is the measured angle between a tangent line at the drop boundary and the solid surface. Such contact angles indicate that the coating layers herein are relatively hydrophobic (i.e. they provide a relatively non-polar surface that does not interact well with polar molecules such as water).

Exemplary precursor gasses suitable for formation of the above referenced coating on the interior surface of the hollow substrate may include hydrocarbon compounds (i.e. compounds containing carbon and hydrogen which may be provided as a gas) such as acetylene ($C_2H_2$), ethylene ($C_2H_4$) and/or methane ($CH_4$) etc., which may be used alone or in combination with precursor gases containing an inorganic element such as the silane compounds noted above ($Si_nH_{2n+2}$), silicon carbide (SiC), silane compounds including substituted aliphatic and/or aromatic functionality hexamethyldisiloxane (HMDSO or $(CH_3)_3$—Si—$(CH_3)_3$), trimethyl silane (3 MS or $SiH(CH_3)_3$), or other types of organic (carbon containing) gases such as perfluoropropane ($CF_3$—$CF_2$—$CF_3$) and/or hexafluoroethane ($CF_3$—$CF_3$) and combinations thereof. Still further, other exemplary precursor gases may include Cr-containing organic gases such as hexacarbonyl chromium ($Cr(CO)_6$) and/or Ti-containing gases such as Tetrakis titanium ($Ti[N(CH_3)_2]_4$).

The coatings noted above may be formed on all of a portion of the interior surface of a hollow part such as hollow part 202 illustrated in FIG. 1. More specifically, a vacuum may first be developed within the hollow part 202 to value of at or below about $10^{-5}$ Torr. The above referenced gases may then be introduced at a flow rate of about 0.5 to 200 standard cubic centimeters per minute (sccm) while obtaining a pressure of about 0.5 to about 100 millitorr, including all values and increments therein. For example, the gases may be introduced at a flow of about 25-75 sccm to obtain a pressure of about 15-35 millitorr which is substantially uniform throughout the hollow substrates noted above. The coating layer may then be applied at a pulse frequency of from about 100 Hz to about 20 kHz, a pulse width of about 5 microseconds to about 40 microseconds which may again negatively bias the tube up to about 10 kV with respect to ground, for a period of up to about 1500 minutes, including all values and increments therein. Furthermore, as alluded to above, a second diamond like top coat may be formed over the first diamond like coating, wherein the second diamond like coating may be sourced from different precursor gases and may be applied at a different thickness, hardness or contact angle values as compared to the first diamond like coating. While the second top coat may also be applied at thicknesses up to about 15.0 μm, it may be appreciated that a top coat may be more typically in the range of up to about 2.0 μm, including all values and increments therein. It is therefore specifically contemplated that more than two coating layers may be applied to the inner surface of a given hollow substrate wherein each layer may individually exhibit different physical properties [e.g. Vickers Hardness in the range of 500-3000, contact angles in the range of 60° to 110°, kinetic coefficient of frictions ($\mu_k$ 0.01-0.20)] wherein any one of such properties may be varied between the layers.

In addition, the coatings herein may be further characterized with respect to the presence of surface chemistry functionality via a technique such as X-ray photoelectron spectroscopy (XPS). XPS may be understood as a quantitative spectroscopic technique that may measure the empirical formula, chemical state and/or electronic state of the elements that exist at the surface of a sample. The XPS measurements may be performed by irradiating a material with a beam of X-rays while simultaneously measuring the kinetic energy (KE) and number of electrons that may be excited in the top 1 to 10 nm of the material being analyzed. The chemical bonding states that have been observed herein include one or more of the following: C—H bonds, C═O bonds, C—O—O— bonds, C—F bonds, and/or C—Si bonds, which as noted above may depend on the various precursor gases used to provide a given plasma.

The tubular substrate with internal surfaces coated as discussed above may be specifically incorporated into a pipeline system for the transportation of materials such as crude oil. In such a manner, a system is provided herein which incorporates at least a portion of pipeline having pipe sections that include plasma coatings on the interior surface. In addition, as noted earlier, it may be appreciated that as crude oil may contain various waxes and hydrates. The application of the coatings herein on the inside surfaces of piping that may be employed for crude oil transport may therefore provide a reduction in wax and/or hydrate build-up which may otherwise restrict oil flow.

The above various features of the present disclosure may now be illustrated by the following non-limiting examples.

Example 1

A number of coatings were initially produced on stainless steel and silicon wafer test coupons mounted on the inside surface of exemplary hollow substrate structures. The general deposition procedure generally included mounting the tubular structures inside of a vacuum chamber and evacuating the chamber to a pressure $1\times10^{-5}$ Torr. The samples were cleaned using an inert gas (argon) plasma to remove residual hydrocarbon and/or metal oxide layers. On a number of the samples a bond coat including silicon was deposited using silane ($SH_4$) gas plasma. Coating layers were then deposited using different precursor gases and various deposition parameters. In some cases a top coating layer was deposited using a different precursor gas mixture. Tables 1-4 summarize the various coating processes carried out for the above reference sputter cleaning process, bond layer formation, and first and second layer formation.

TABLE 1

Coating Process Parameters - Sputter Cleaning Process
Sputter Clean

| Sample ID | Gas | Time (min) | Pressure (mTorr) | Bias (kV) |
|---|---|---|---|---|
| SH105 | Ar | 30 | 20 | 4.1 |
| SH106 | Ar | 30 | 20 | 4.1 |
| SH107 | Ar | 30 | 20 | 4.1 |
| SH108 | Ar | 30 | 20 | 4.1 |
| SH109 | Ar | 30 | 12 | 4.1 |
| SH110 | Ar | 30 | 13 | 4.1 |
| SH111 | Ar | 30 | 19 | 4.1 |
| SH112 | Ar | 30 | 20 | 4.1 |
| SH113 | Ar | 30 | 20 | 4.1 |
| SH114 | Ar | 30 | 20 | 4.1 |
| SH115 | Ar | 30 | 20 | 4.1 |
| SH116 | Ar | 30 | 20 | 4.1 |
| SH117 | Ar | 30 | 20 | 4.1 |
| SH118 | Ar | 30 | 20 | 4.1 |
| SH119 | Ar | 30 | 15 | 4.1 |
| SH120 | Ar | 30 | 15 | 4.1 |
| SH121 | Ar | 30 | 15 | 4.1 |
| SH122 | Ar | 30 | 15 | 4.1 |

TABLE 2

Coating Process Parameters - Bond Layer Application
Bond Layer

| Sample ID | Gas | Time (min) | Pressure (mTorr) | Bias (kV) |
|---|---|---|---|---|
| SH105 | $SiH_4$ | 15 | 25 | 4.1 |
| SH106 | $SiH_4$ | 15 | 26 | 4.1 |
| SH107 | $SiH_4$ | 15 | 20 | 4.1 |
| SH108 | $SiH_4$ | 15 | 28 | 4.1 |
| SH109 | $SiH_4$ | 15 | 23 | 4.1 |
| SH110 | $SiH_4$ | 15 | 24 | 4.1 |
| SH111 | $SiH_4$ | 15 | 25 | 4.1 |
| SH112 | $SiH_4$ | 15 | 26 | 4.1 |
| SH113 | $SiH_4$ | 15 | 26 | 4.1 |
| SH114 | $SiH_4$ | 15 | 26 | 4.1 |
| SH115 | N/A | | | |
| SH116 | N/A | | | |
| SH117 | N/A | | | |
| SH118 | N/A | | | |
| SH119 | $SiH_4$ | 15 | 15 | 4.1 |
| SH120 | $SiH_4$ | 15 | 15 | 4.1 |
| SH121 | $SiH_4$ | 15 | 15 | 4.1 |
| SH122 | $SiH_4$ | 15 | 15 | 4.1 |

TABLE 3

Coating Process Parameters - Coating
Diamond Like Carbon Layer

| Sample ID | Gas | Time (min) | Flow (sccm) | Pressure (mTorr) | Bias (kV) |
|---|---|---|---|---|---|
| SH105 | $C_2H_2$ | 20 | 60 | 20 | 4.1 |
| SH106 | $C_2H_2$ | 20 | 60 | 21 | 4.1 |
| SH107 | $C_2H_2$ | 20 | 60 | 20 | 4.1 |
| SH108 | $C_2H_2/SiH_4$ | 20 | 40/20 | 23 | 4.1 |
| SH109 | $C_2H_2/SiH_4$ | 20 | 50 | 27 | 4.1 |
| SH110 | $C_2H_2$ | 20 | 50 | 24 | 4.1 |
| SH111 | $C_2H_2$ | 20 | 50 | 23 | 4.1 |
| SH112 | $C_2H_2$ | 20 | 50 | 23 | 4.1 |
| SH113 | $C_2H_2$ | 20 | 50 | 24 | 4.1 |
| SH114 | $C_2H_2$ | 20 | 50 | 27 | 4.1 |
| SH115 | SiC (3MS) | 30 | 21 | 18 | 4.1 |
| SH116 | HMDSO | 30 | 42C | 27 | 4.1 |
| SH117 | 3MS | 30 | 21 | 17 | 6.2 |
| SH118 | HMDSO | 30 | 42C | 23 | 4.1 |
| SH119 | $C_2H_2/SiH_4$ | 120 | 40/20 | 15 | 4.1 |
| SH120 | $C_2H_2$ | 60 | 60 | 15 | 4.1 |
| SH121 | $C_2H_2$ | 60 | 60 | 15 | 4.1 |
| SH122 | $C_2H_2$ | 60 | 60 | 15 | 4.1 |

TABLE 4

Coating Process Parameters - Top Layer Application
Top Layer

| Sample ID | Gas | Time (min) | Pressure (mTorr) | Bias (kV) |
|---|---|---|---|---|
| SH105 | $HMDSO/C_2H_2$ | 15 | 21 | 4.1 |
| SH106 | $C_2F_6/C_2H_2$ | 15 | 22-24 | 4.1 |
| SH107 | $C_3F_8/C_2H_2$ | 15 | 23-24 | 4.1 |
| SH108 | N/A | | | |
| SH109 | N/A | | | |
| SH110 | $C_3F_8/C_2H_2$ | 15 | 23-34 | 4.1 |
| SH111 | $HMDSO/C_2H_2$ | 15 | 24-29 | 4.1 |
| SH112 | $C_2F_6/C_2H_2$ | 15 | 22-24 | 4.1 |
| SH113 | N/A | | | |
| SH114 | $C_2F_6/HMDSO/C_2H_2$ | 15 | 26-31 | 4.1 |
| SH115 | N/A | | | |
| SH116 | N/A | | | |
| SH117 | N/A | | | |
| SH118 | $C_2F_6/HMDSO$ | 30 | 24-25 | 4.1 |
| SH119 | N/A | | | |
| SH120 | $C_3F_8/C_2H_2$ | 15 | 14-15 | 4.1 |
| SH121 | $C_2F_6/C_2H_2$ | 15 | 13-15 | 4.1 |
| SH122 | $HMDSO/C_2H_2$ | 15 | 21-27 | 4.1 |

The water contact angle of a number of the above samples was then examined. Table 5 summarizes the results of such contact angle measurements.

TABLE 5

Contact Angle Measurements

| Sample ID | Contact Angle Measurements | | | | | | Average | St. Dev. | % St. Dev. |
|---|---|---|---|---|---|---|---|---|---|
| SH109 | 98 | 91 | 94 | 92 | 97 | 89 | 93.5 | 3.5 | 3.8 |
| SH110 | 92 | 90 | 88 | 86 | 86 | 86 | 88.0 | 2.5 | 2.9 |
| SH111 | 96 | 103 | 93 | 97 | 90 | 92 | 95.2 | 4.6 | 4.9 |
| SH112 | 97 | 91 | 92 | 93 | 81 | 90 | 90.7 | 5.3 | 5.9 |
| SH113 | 90 | 88 | 90 | 93 | 93 | 89 | 90.5 | 2.1 | 2.3 |
| SH114 | 73 | 71 | 74 | 70 | 78 | 71 | 72.8 | 2.9 | 4.0 |
| SH115 | 92 | 92 | 90 | 92 | 82 | 87 | 89.2 | 4.0 | 4.5 |
| SH116 | 98 | 98 | 98 | 98 | 95 | 96 | 97.2 | 1.3 | 1.4 |
| SH117 | 94 | 95 | 96 | 96 | 104 | 103 | 98.0 | 4.3 | 4.4 |
| SH118 | 90 | 95 | 100 | 96 | 95 | 96 | 95.3 | 3.2 | 3.4 |

In addition, the primary bonding chemical states were examined for various coatings utilizing X-ray photoelectron spectroscopy (XPS). Table 6 summarizes the results of the analysis.

TABLE 6

XPS Measurements

| Sample ID | Coating | Primary Bonding (XPS) | | | |
|---|---|---|---|---|---|
| SH110 | Si/DLC/F + DLC | C—H | C=O | C—O—O | C—F |
| SH112 | Si/DLC/F + DLC | C—H | C=O | C—O—O | C—F |
| SH113 | DLC | C—H | C=O | C—O—O | |
| SH116 | HMDSO | C—Si | C—H | | |
| SH117 | SiC(3MS) | C—Si | C—H | | |
| SH118 | $C_2F_6$ + HMSDO | C—Si | C—H | C=O | |
| SH119 | Si/Si + DLC | C—H | C—H | C=O | C—O—O |
| SH120 | Si/$C_2H_2$ + $C_3F_8$ | C—H | C=O | C—O—O | C—F |
| SH121 | Si/$C_2H_2$ + $C_2F_6$ | C—H | C=O | C—O—O | C—F |
| SH122 | Si/DLC/HMDSO + DLC | C—Si | C—H | C=O | |

Coatings were also applied to pipe (10 foot in length at about 4.0 inch diameter). The plasma coatings were applied in accordance with the above protocols and again, to evaluate coating efficiency, silicon coupons were positioned on the interior surface of the pipe to evaluate coating performance.

TABLE 7

Sample Deposition on Hollow Substrate (Pipe)

| | | Deposition | | | |
|---|---|---|---|---|---|
| Sample No. | Time (min) | Pressure (mTorr) Inlet/Outlet | Time (hr) | Pressure (mTorr) Inlet/Outlet | Gas |
| SH-3 | 10 | 16.2/15.7 | 2.5 | 15/11 | TMS |
| SH-4 | 10 | 15/14 | 1.5 | 17.7/13 | TMS |

TABLE 8

Thickness and Water Contact Angles for Si Coupons

| Sample No. | Location | Thickness (μm) | Contact Angles | | | | | | Ave. | St. Dev. |
|---|---|---|---|---|---|---|---|---|---|---|
| SH-3 | 1' Inlet | 0.6 | 81 | 76 | 82 | 79 | | | 79.5 | 2.6 |
| | 1' Pump | 0.3 | 76 | 74 | 72 | 72 | 78 | 78 | 75.0 | 2.8 |
| | 3' Pump | 0.6 | 80 | 79 | 72 | 77 | 67 | 68 | 73.8 | 5.6 |
| | Center | 0.8 | 86 | 79 | 82 | 85 | 78 | 76 | 81.0 | 4.0 |
| SH-4 | Center | 1.7 | 80 | 73 | 83 | 80 | 81 | 80 | 79.5 | 3.4 |
| | Pumpside 6" | 2.0 | 93 | 91 | 93 | 88 | 80 | 80 | 87.5 | 6.1 |
| | Inlet 6" | 2 | 88 | 84 | 85 | 84 | | | 85.3 | 1.9 |
| | Inlet 2' | 2.5 | 91 | 85 | 87 | 87 | | | 87.5 | 2.5 |

In addition, to the above, coatings were applied to 20 foot long pipe (6.10 meters) at about 4.0 inch diameter (10.2 cm) with similar results to therefore provide useful coatings on a hollow substrate which may therefore be employed, as noted above, in applications such as crude oil transport. Persons of ordinary skill in the art will therefore recognize that various modifications that may be made to the disclosure herein and should not be considered limiting with respect to the invention defined by the following claims.

What is claimed is:

1. A method for plasma ion deposition and coating formation comprising:
   providing a vacuum chamber comprising a hollow substrate having a length, diameter and interior surface and an electrode provided within the interior of said hollow substrate, extending along all or a portion of said hollow substrate length, wherein said electrode is hollow and includes one or more spaced openings to provide a precursor gas and said electrode is coupled to a gas inlet port wherein said gas travels down the length of said hollow electrode and is uniformly distributed within said hollow substrate;
   reducing the pressure in said chamber to a value of at or below about $10^{-5}$ Torr;
   introducing an inert gas into said chamber to obtain a pressure of about 0.5 mTorr to 100 mTorr, applying a negative bias to said hollow substrate and sputter cleaning said substrate;
   introducing a coupling layer precursor gas including silane compounds into said chamber, applying a negative bias to said hollow substrate and forming a coupling layer;
   introducing a first coating precursor gas at a flow rate of about 0.5 to 200 sccm and obtaining a pressure of about 0.5 to 100 millitorr and generating a plasma within said chamber;
   applying a negative bias to said hollow substrate to draw ions from said plasma to said interior surface of said hollow substrate to form a first diamond like carbon coating;
   introducing at least one second coating precursor gas into said chamber and forming a second diamond like carbon coating having a thickness of up to 15.0 μm, wherein at least one second coating precursor gas is different from said first coating precursor gas, and wherein said coating has a Vickers Hardness Number (Hv) of at least 500.

2. The method of claim 1 wherein said hollow substrate has an aspect ratio of length divided by diameter (L/D) of greater than 2.

3. The method of claim 1 wherein said coating has a water contact angle of about 60 degrees to about 110 degrees.

4. The method of claim 1 wherein said coating has a kinetic coefficient of friction of about 0.01-0.20.

5. The method of claim 1 wherein said step of applying a negative bias to said interior surface of said hollow substrate comprises applying a negative voltage up to about 10 kV having a pulse frequency from about 500 Hz to about 20 kHz at a pulse width of about 5 microseconds to about 40 microseconds.

6. The method of claim 1 including exposing said interior surface of said hollow substrate to a cleaning by an inert gas plasma.

7. The method of claim 6 wherein said interior surface of said hollow substrate includes metallic oxides and said cleaning removes about 75-100% of said oxides.

8. The method of claim 1 wherein said coupling layer precursor gas is one or more of the following: (a) silane compounds of the general formula $Si_nH_{2n+2}$ wherein n has a value of 1-10; or (b) silane compounds having substituted aliphatic and/or aromatic functionality.

9. The method of claim 1 wherein said first and second precursor gases are selected from the group consisting of hydrocarbon compounds, silane compounds of the general formula $Si_nH_{2n+2}$ wherein n has a value of 1-10, silicon carbide, silane compounds having aliphatic and/or aromatic functionality, perfluoropropane, hexafluoropropane, chromium containing organic compounds, titanium containing compounds, and combinations thereof.

10. The method of claim 1 wherein said coating has a thickness of about 0.1 to about 15 microns.

11. The method of claim 1 wherein said coating comprises at least two layers wherein said layers have the following properties:
- a Vickers Hardness in the range of about 500-3000;
- a water contact angle in the range of about 60° to 110°;
- a kinetic coefficient of friction of about 0.01-0.20 wherein the value of at least one of the above properties differs as between said layers.

12. The method of claim 1 wherein said hollow substrate is positioned at an angle of about 45 degrees to about 90 degrees with respect to a horizontal plane.

13. A method for plasma ion deposition and coating formation comprising:
- providing a vacuum chamber comprising a hollow substrate having a length, diameter and interior surface including an electrode provided within the interior of said hollow substrate, said electrode extending along all or a portion of said hollow substrate length, wherein said electrode is hollow and includes one or more spaced openings to provide a plasma precursor gas and wherein said electrode is coupled to a gas inlet port wherein said gas travels down the length of said hollow electrode and is uniformly distributed within said hollow substrate;
- reducing the pressure in said chamber;
- generating a plasma within said chamber;
- applying a negative bias to said hollow substrate to draw ions from said plasma to said interior surface of said hollow substrate to form a coating wherein said coating has a Vickers Hardness Number (Hv) of at least 500.

14. The method of claim 13 wherein said hollow substrate has an aspect ratio of length divided by diameter (L/D) of greater than 2.

* * * * *